(12) United States Patent
Wang

(10) Patent No.: US 11,605,340 B2
(45) Date of Patent: Mar. 14, 2023

(54) ONE-BIT MEMORY CIRCUIT FOR AMOLED PANEL SUB-PIXELS

(71) Applicant: GOHI MICROELECTRONICS. CO., LTD., Nanjing (CN)

(72) Inventor: Lei Wang, Nanjing (CN)

(73) Assignee: GOHI MICROELECTRONICS. CO., LTD., Nanjing (CN)

(*) Notice: Subject to any disclaimer, the term of this patent is extended or adjusted under 35 U.S.C. 154(b) by 122 days.

(21) Appl. No.: 17/270,822

(22) PCT Filed: Aug. 12, 2019

(86) PCT No.: PCT/CN2019/100232
§ 371 (c)(1),
(2) Date: Feb. 23, 2021

(87) PCT Pub. No.: WO2020/042896
PCT Pub. Date: Mar. 5, 2020

(65) Prior Publication Data
US 2021/0343237 A1    Nov. 4, 2021

(30) Foreign Application Priority Data

Aug. 31, 2018 (CN) .......................... 201811010589.8

(51) Int. Cl.
*G09G 3/3233* (2016.01)
*G11C 19/28* (2006.01)

(52) U.S. Cl.
CPC .......... *G09G 3/3233* (2013.01); *G11C 19/28* (2013.01); *G09G 2300/0842* (2013.01); *G09G 2330/023* (2013.01)

(58) Field of Classification Search
CPC ......... G09G 3/3233; G09G 2300/0842; G09G 2330/023; G09G 2300/0819; G09G 2300/0866; G09G 2330/021; G11C 19/28; G11C 11/405; G11C 19/184
See application file for complete search history.

(56) References Cited

U.S. PATENT DOCUMENTS

| | | | | |
|---|---|---|---|---|
| 2012/0306840 A1* | 12/2012 | Han | .................. | G09G 3/3233 345/82 |
| 2013/0201172 A1* | 8/2013 | Jeong | .................. | G09G 3/3266 345/82 |
| 2014/0118231 A1* | 5/2014 | Yang | .................. | G09G 3/3233 345/82 |
| 2014/0145918 A1* | 5/2014 | Kwak | .................. | G09G 3/3266 345/82 |

(Continued)

*Primary Examiner* — Jeff Piziali
(74) *Attorney, Agent, or Firm* — Patent Consulting, LLC

(57) ABSTRACT

A one-bit memory circuit for amoled panel sub-pixels is provided with an auxiliary latch circuit and a control switch on the basis of an existing one-bit memory circuit. The control switch is configured for controlling the activation of the auxiliary latch circuit. When the control switch is turned on, the auxiliary latch circuit, together with a voltage-controlled current MOS transistor and a light emitting diode in the existing one-bit memory, forms a latch for latching the voltage on a capacitor in the existing memory circuit. The one-bit memory circuit of the present invention reasonably utilizes components in the existing circuit and cuts down additional components required for achieving the latch function.

3 Claims, 6 Drawing Sheets

(56) References Cited

U.S. PATENT DOCUMENTS

| | | | | |
|---|---|---|---|---|
| 2014/0152191 A1* | 6/2014 | Yang | .................... | G09G 3/3233 |
| | | | | 257/40 |
| 2014/0292623 A1* | 10/2014 | Moon | .................... | G09G 3/006 |
| | | | | 345/82 |
| 2016/0062522 A1* | 3/2016 | Yang | ....................... | G06F 3/042 |
| | | | | 345/174 |
| 2016/0125808 A1* | 5/2016 | Hsu | ...................... | G09G 3/3233 |
| | | | | 345/212 |
| 2019/0035330 A1* | 1/2019 | Li | ....................... | G09G 3/3258 |
| 2021/0027706 A1* | 1/2021 | Zhang | ................... | G09G 3/3233 |

* cited by examiner

ONE-BIT MEMORY CIRCUIT FOR AMOLED PANEL SUB-PIXELS

TECHNICAL FIELD

The present invention relates to an electronic circuit, in particular to a one-bit memory circuit for amoled panel sub-pixels.

BACKGROUND

FIG. 1 shows a basic circuit of an existing one-bit memory for amoled sub-pixels, comprising a switch transistor M2, a voltage-controlled current transistor M1, a charge storage capacitor and a light emitting diode. The voltage on a data line is transferred to a charge storage point when the switch transistor M2 is turned on, and is in a charge holding state when the M2 is turned off.

FIG. 2 shows a working waveform of the basic circuit of the existing one-bit memory for amoled sub-pixels. As can be seen from FIG. 2, in order to sustain the voltage on the charge storage capacitor, constant refreshing is required, for example, a signal scan2 is to be applied in a short time after applying a signal scan1 on a scan line, because the voltage on the charge storage capacitor cannot be sustained for a long period of time in the existing circuit due to leakage characteristics of devices, and the charge on the charge storage capacitor will leak out over time. Therefore, constant refreshing is required, and the refreshing process is extremely power-consuming, which is not conducive to prolonging the battery life of mobile devices.

SUMMARY

Purpose of the present invention: to solve the above problems, the present invention provides a one-bit memory circuit for amoled panel sub-pixels to reduce system power consumption with images unchanged.

Technical solution: to achieve the above design purpose, the one-bit memory circuit for amoled panel sub-pixels provided by the present invention comprises a first MOS transistor, a second MOS transistor, a capacitor, a light emitting diode and an auxiliary latch circuit; wherein a gate and a first terminal except the gate of the second MOS transistor are connected to a scan line and a data line respectively, and a second terminal except the gate is connected to a gate of the first MOS transistor via a charge storage point; a first terminal and a second terminal except the gate of the first MOS transistor are connected to a first power terminal and a first terminal of the light emitting diode respectively; a second terminal of the light emitting diode is connected to a second power terminal; both terminals of the capacitor are connected to the charge storage point and the first power terminal respectively; the auxiliary latch circuit receives a latch signal and is connected to the charge storage point, and forms a latch together with the first MOS transistor and the light emitting diode for latching the voltage on the capacitor.

Further, the auxiliary latch circuit comprises a fourth MOS transistor and a fifth MOS transistor; wherein a gate of the fourth MOS transistor is connected to the first terminal of the light emitting diode, and a first terminal and a second terminal except the gate of the fourth MOS transistor are connected to the first power terminal and the charge storage point respectively; a gate of the fifth MOS transistor receives a latch signal, and a first terminal and a second terminal except the gate are connected to the charge storage point and the second power terminal respectively.

Further, the one-bit memory circuit further comprises a control switch, wherein the auxiliary latch circuit is connected to the charge storage point via the control switch; and the control switch is controlled to be turned off in a high quality mode and turned on in a low quality mode.

Further, the control switch comprises a third MOS transistor, and the auxiliary latch circuit comprises a fourth MOS transistor and a fifth MOS transistor; wherein a second terminal except a gate of the fourth MOS transistor is connected to a first terminal except a gate of the fifth MOS transistor to form a bridge arm; a first terminal and a second terminal except a gate of the third MOS transistor are connected to the charge storage point and the midpoint of the bridge arm respectively; the gate of the fourth MOS transistor is connected to the first terminal of the light emitting diode, and a first terminal except the gate of the fourth MOS transistor is connected to the first power terminal; the gate of the third MOS transistor is connected to the gate of the fifth MOS transistor and to a second terminal except the gate of the fifth MOS transistor; and the gate of the fifth MOS transistor receives a latch signal.

Further, the control switch comprises a third MOS transistor, and the auxiliary latch circuit comprises a fourth MOS transistor and a fifth MOS transistor; wherein a second terminal except a gate of the fourth MOS transistor is connected to a first terminal except a gate of the fifth MOS transistor to form a bridge arm; a first terminal and a second terminal except a gate of the third MOS transistor are connected to the charge storage point and the midpoint of the bridge arm respectively; the gate of the fourth MOS transistor is connected to the first terminal of the light emitting diode, and a first terminal except the gate of the fourth MOS transistor is connected to the first power terminal; the gate of the third MOS transistor is connected to the gate of the fifth MOS transistor; a second terminal except the gate of the fifth MOS transistor is connected to the second power terminal; and the gate of the fifth MOS transistor receives a latch signal.

Further, the control switch comprises a third MOS transistor, and the auxiliary latch circuit comprises a fourth MOS transistor and a fifth MOS transistor; wherein a second terminal except the gate of the fourth MOS transistor is connected to a first terminal except the gate of the fifth MOS transistor to form a bridge arm; a first terminal and a second terminal except the gate of the third MOS transistor are connected to the charge storage point and the midpoint of the bridge arm respectively; the gate of the fourth MOS transistor is connected to the first terminal of the light emitting diode, and the first terminal except the gate of the fourth MOS transistor is connected to the first power terminal; the gate of the third MOS transistor is connected to the second terminal except the gate of the fifth MOS transistor; the gate of the fifth MOS transistor is connected to the second power terminal; and the second terminal except the gate of the fifth MOS transistor receives a latch signal.

Benefits: compared with the prior art, the present invention has the following advantages:

1. The amoled sub-pixel circuit is enabled to work in two states, i.e., a high quality state and a low quality (e.g., 8-colors mode) state.

2. When working in a low power consumption state and images remain unchanged, the system power consumption can be greatly reduced and the system battery life can be prolonged.

3. With the simple structure, the one-bit memory circuit makes maximum use of components in the existing circuit to achieve the latch function, thereby reducing the number of additional components required and facilitating the integration of the circuit.

DETAILED DESCRIPTION

The technical solution of the present invention will be further described with reference to the drawings and embodiments.

Figure 1:
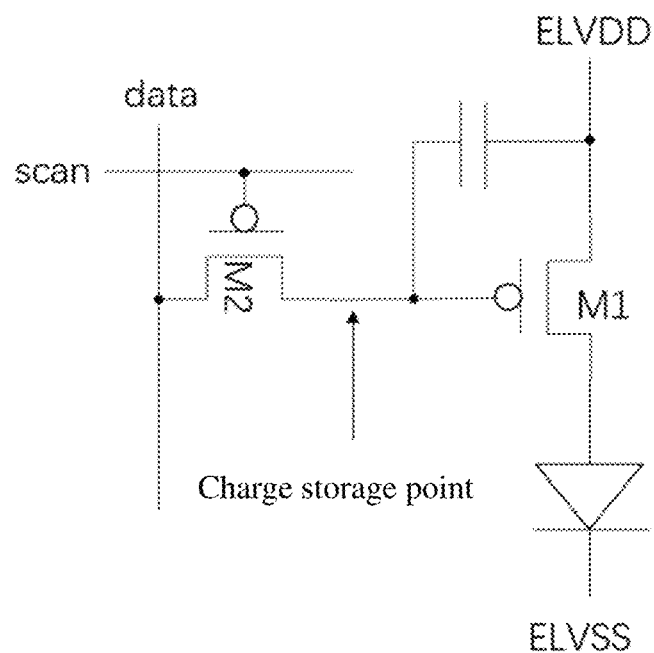
FIG. 1 is a circuit diagram of an existing one-bit memory circuit for amoled panel sub-pixels.
Figure 2:
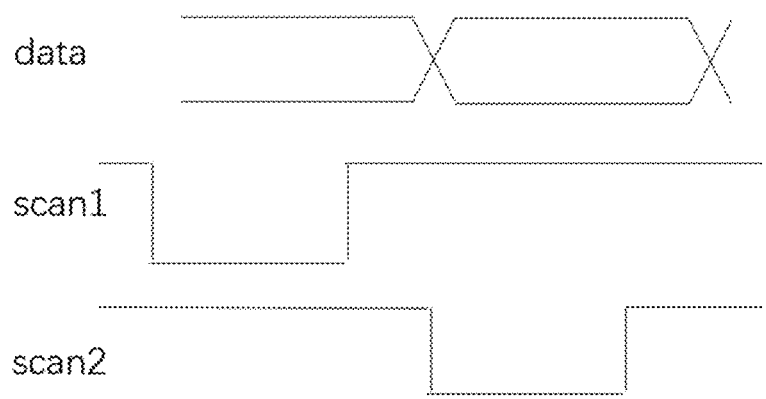
FIG. 2 shows a working waveform of an existing one-bit memory circuit for amoled panel sub-pixels.
Figure 3:
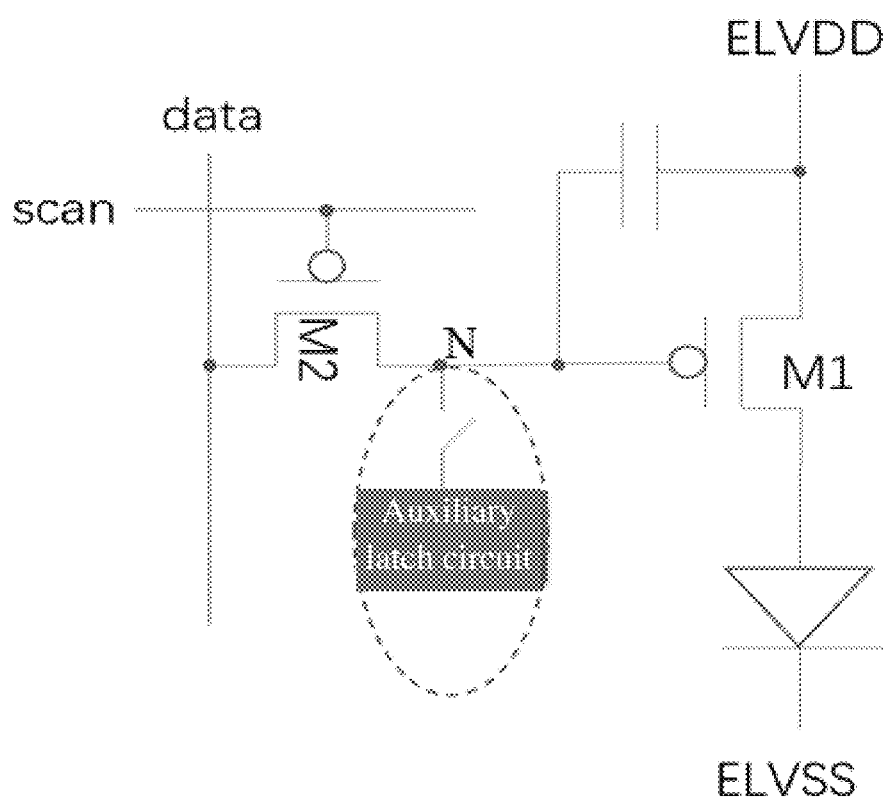
FIG. 3 is a schematic diagram of a one-bit memory circuit with a control switch according to the present invention, in which all MOS transistors used are PMOS transistors.

As shown in FIG. 3, the one-bit memory circuit for amoled panel sub-pixels of the present invention comprises a voltage-controlled current transistor M1, a switch transistor M2, an auxiliary latch circuit, a control switch, a charge storage capacitor and a light emitting diode. Both the voltage-controlled current transistor M1 and the switch transistor M2 are PMOS transistors. A gate and a first terminal except the gate of the switch transistor M2 are connected to a scan line and a data line respectively, and a second terminal except the gate of the switch transistor M2 is connected to a gate of the voltage-controlled current transistor M1 via a charge storage point. A first terminal and a second terminal except the gate of the voltage-controlled current transistor M1 are connected to an ELVDD terminal (i.e., the high level terminal of the power supply) and an anode of the light emitting diode respectively. A cathode of the light emitting diode is connected to an ELVSS terminal (i.e., the low level terminal of the power supply or a ground terminal). Both terminals of the charge storage capacitor are connected to the charge storage point and the ELVDD terminal respectively. The auxiliary latch circuit arranged between the switch transistor M2 and the charge storage capacitor is connected to the charge storage point N via the control switch. The auxiliary latch circuit receives a latch signal, and forms a latch together with the voltage-controlled current transistor M1 and the light emitting diode for latching the voltage on the charge storage capacitor. In this way, the one-bit memory circuit makes maximum use of components in the existing circuit to achieve the latch function, thereby reducing the number of additional components required and facilitating the integration of the circuit.

Figure 4A:
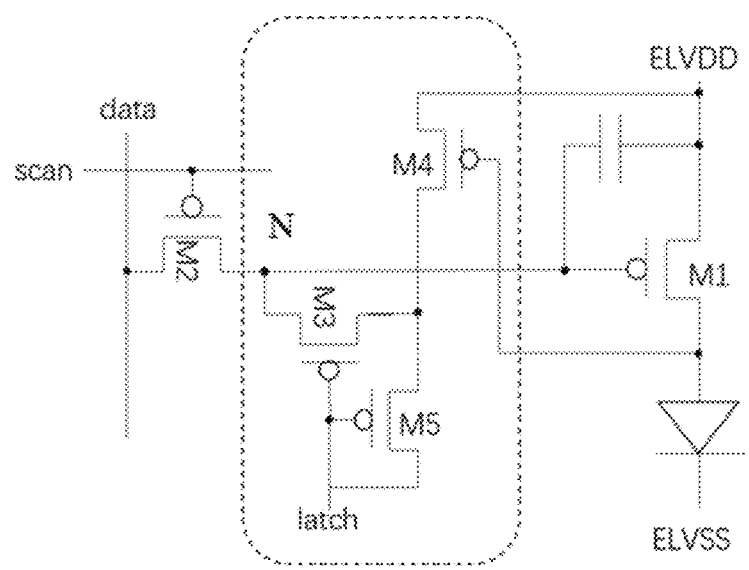
FIG. 4a shows one specific embodiment of the one-bit memory circuit with a control switch in FIG. 3, in which all MOS transistors used are PMOS transistors.
Figure 4B:
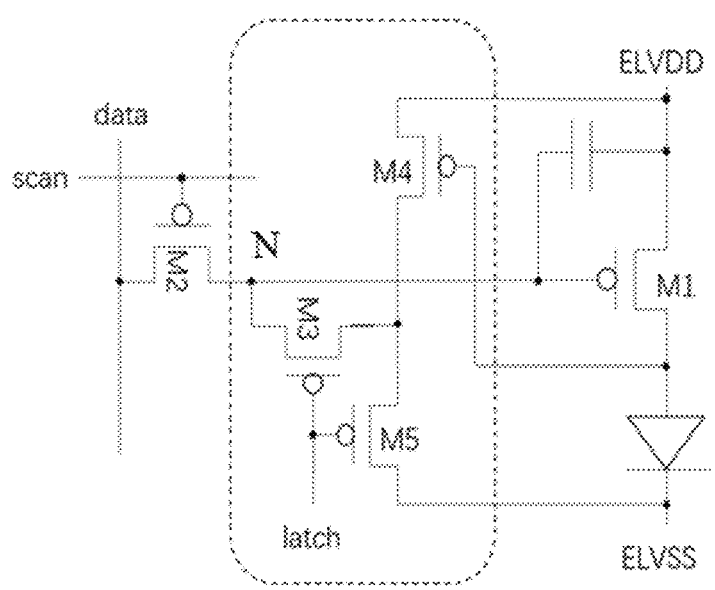
FIG. 4b shows one specific embodiment of the one-bit memory circuit with a control switch in FIG. 3, in which all MOS transistors used are PMOS transistors.
Figure 4C:
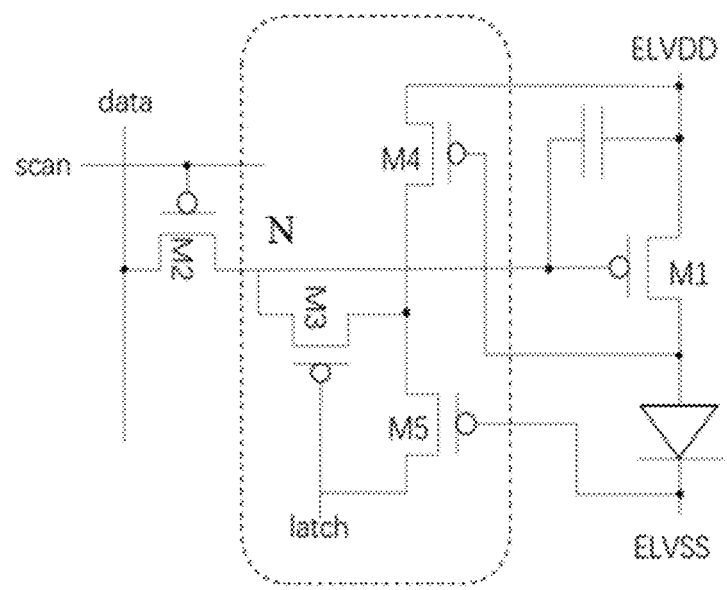
FIG. 4c shows one specific embodiment of the one-bit memory circuit with a control switch in FIG. 3, in which all MOS transistors used are PMOS transistors.

The three different embodiments in FIGS. 4(a) to 4(c) correspond to three different embodiments of the auxiliary latch circuit and the control switch described above.

In FIG. 4(a), the control switch is embodied by a switch transistor M3, and the auxiliary latch circuit is embodied by MOS transistors M4 and M5. A second terminal except the gate of the M4 and a first terminal except the gate of M5 are connected sequentially to form a bridge arm, and a first terminal except the gate and a second terminal of the M3 are connected to the charge storage point and the midpoint of the bridge arm respectively. The gate of the M4 is connected to a first terminal of the light emitting diode, and a first terminal except the gate of the M4 is connected to an ELVDD terminal. The gate of the M3 is connected to the gate of the M5 and to a second terminal except the gate of the M5. The latch signal is received by the gate of the M5.

FIG. 4(b) differs from FIG. 4(a) in that a second terminal except the gate of the M5 is connected to an ELVSS terminal rather than the gate of the M3.

FIG. 4(c) differs from FIG. 4(a) in that the gate of the M5 is connected to an ELVSS terminal rather than the gate of the M3. The latch signal is received by a second terminal except the gate of the M5.

In FIGS. 4(a) to 4(c), the M3 to the M5 are PMOS transistors.

Although the three connection modes in FIG. 4(a) to FIG. 4(c) are different in specific forms, the essence is the same, that is, the upper half (i.e., the M4) of the bridge arm in the auxiliary latch circuit forms a voltage-controlled pull-up circuit, and the lower half (i.e., the M5) is an MOS transistor connected by a diode (the gate is short-circuited with the second terminal except the gate). When the control switch M3 is turned on, if the latch signal is at a low level (i.e., latch=ELVSS), it means that the circuit is in a latch state. At the moment, one terminal of the M5 is grounded (ELVSS), when the charge storage point N is at a high level, the voltage-controlled current transistor M1 is turned off, and the potential of the second terminal except the gate of the M1 is pulled down to the ELVSS by the light emitting diode, at the moment, the M4 is turned on, the M5 is equivalent to a large resistance, and the charge storage point is kept at a high level (i.e., logic "1"); when the charge storage point N is at a low level, the voltage-controlled current transistor M1 is turned on, and the potential of the second terminal except the gate of the M1 is to be pulled up, at the moment, the M4 is turned off, and the M5 pulls down the potential of the charge storage point N and keeps the charge storage point N at a low level (i.e., logic "0").

In this way, the one-bit memory circuit of the present invention has the function of locking the state, the state will be kept as long as the power is not turned off, and the logic "0" and "1" can be latched. Therefore, three sub-pixels in RGB arrangement can keep 8 colors (the intermediate gray scale cannot be saved). In addition, the introduction of the control switch enables the display to work in a high quality state and a low quality state (e.g., 8-colors images). The control switch M3 is turned off in the high quality state, and turned on in the low power consumption state. In the low quality state, when images need to remain unchanged, it is not required to refresh the charge storage capacitor in the sub-pixel circuit frequently because the circuit has a latch function, thus greatly reducing the system power consumption and prolonging the system battery life.

Figure 5:
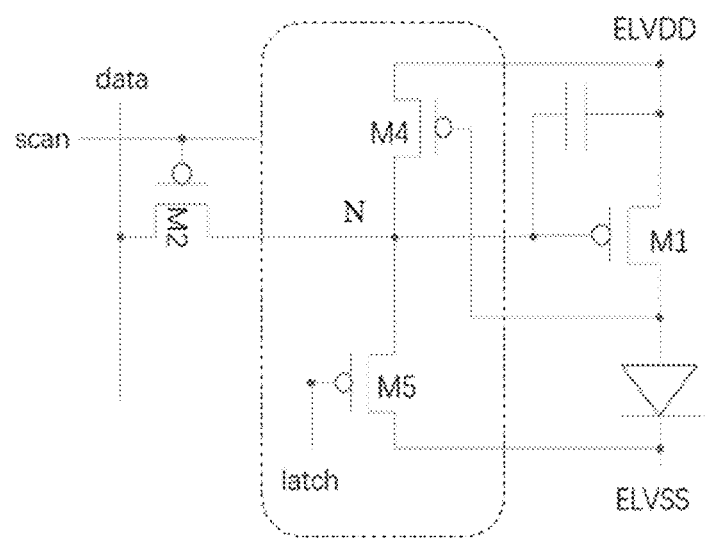
FIG. 5 is a schematic diagram of a one-bit memory circuit without a control switch according to the present invention, in which all MOS transistors used are PMOS transistors.
Figure 6A:
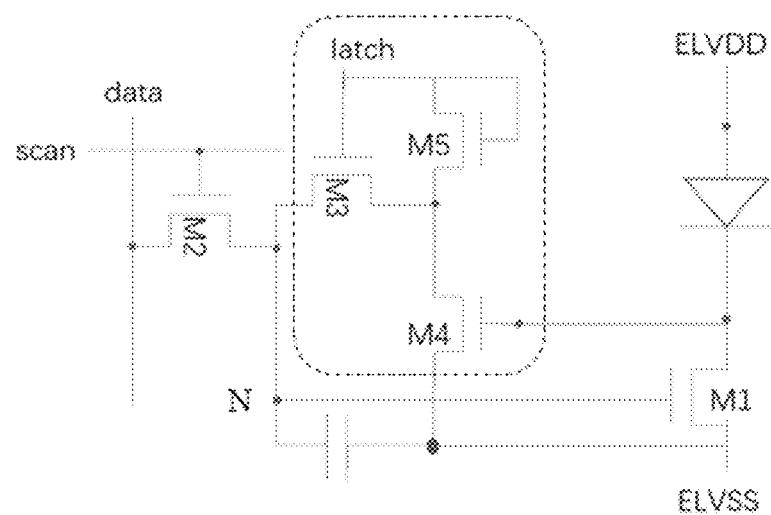
FIG. 6a shows one specific embodiment of a one-bit memory circuit with a control switch according to the present invention, in which all MOS transistors used are NMOS transistors.
Figure 6B:
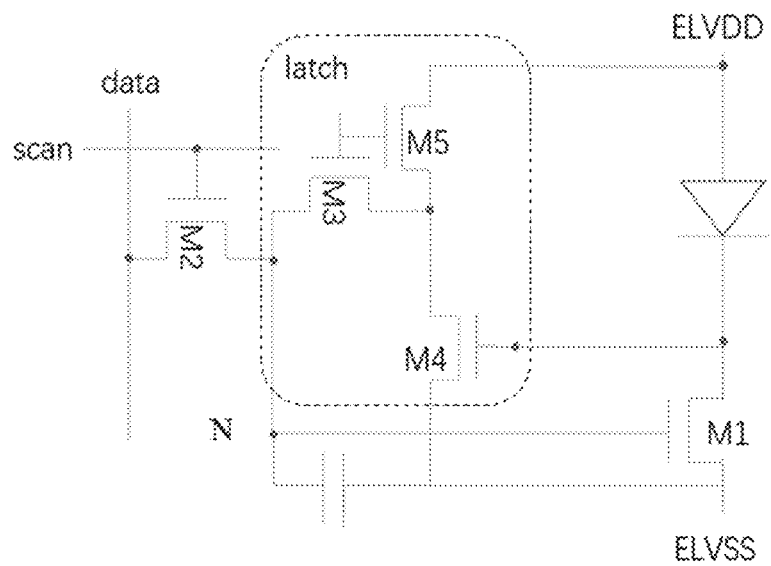
FIG. 6b shows one specific embodiment of a one-bit memory circuit with a control switch according to the present invention, in which all MOS transistors used are NMOS transistors.
Figure 6C:
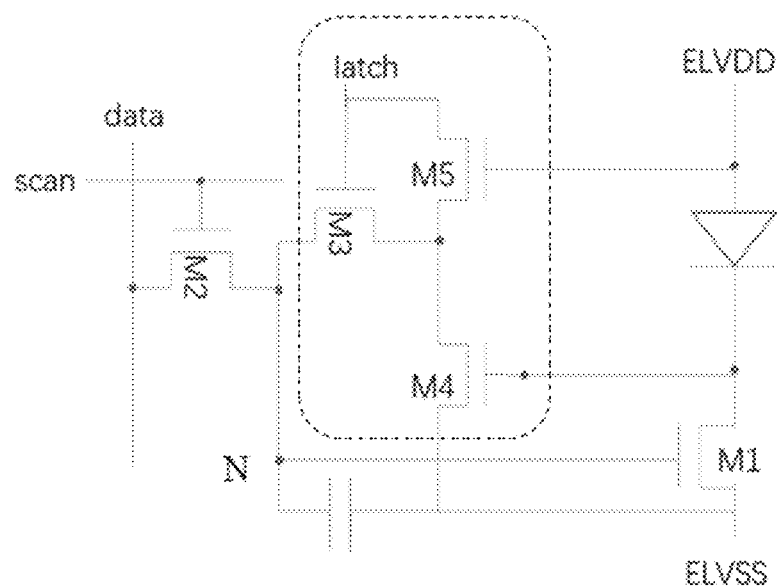
FIG. 6c shows one specific embodiment of a one-bit memory circuit with a control switch according to the present invention, in which all MOS transistors used are NMOS transistors.
Figure 7:
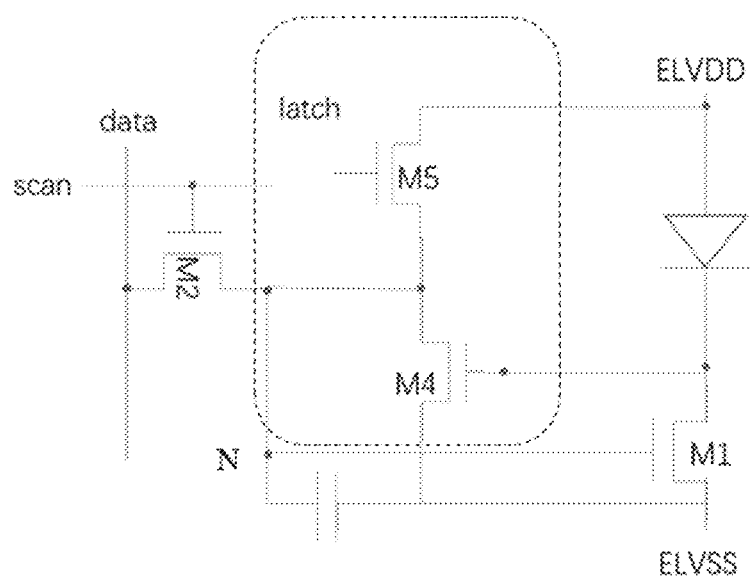
FIG. 7 is a schematic diagram of a one-bit memory circuit without a control switch according to the present invention, in which all MOS transistors are NMOS transistors.

In other embodiments, it is also possible to remove the control switch M3 and connect the auxiliary latch circuit directly to the charge storage capacitor, that is, the M3 is removed, and original nodes at the first terminal and the second terminal except the gate of the M3 are short-circuited at the charge storage point, with the latch signal being received by the gate of the M5, as shown in FIG. 5. At the moment, the circuit can only work in an 8-colors mode, which is suitable for applications with high requirements for low power consumption and low requirements for image quality. In the mode, driver chips can also be simplified, and no DC power consumption can be achieved basically at the driver stage, which is suitable for mobile application systems such as smart watches and children's watches.

In addition, although all MOS transistors used in the above embodiments are PMOS transistors, the one-bit memory circuit for amoled panel sub-pixels of the present invention can also be implemented by NMOS transistors, with the corresponding circuit diagrams as shown in FIGS. 6(a) to 6(c) and FIG. 7 respectively. The working principle of the memory circuit using NMOS transistors is illustrated by taking FIG. 6(a) as an example: when the control switch M3 is turned on, if the latch signal is at a high level (i.e., latch=ELVDD), it means that the circuit is in a latch state. At the moment, one terminal of the M5 is connected to a high level terminal (ELVDD), when the charge storage point N is at a low level, the voltage-controlled current transistor M1 is turned off, and the potential of the second terminal except the gate of the M1 is pulled down to the ELVDD by the light emitting diode, at the moment, the M4 is turned on, the M5 is equivalent to a large resistance, and the charge storage point is kept at a low level (i.e., logic "0"); when the charge storage point N is at a high level, the voltage-controlled current transistor M1 is turned on, and the potential of the second terminal except the gate of the M1 is to be pulled down, at the moment, the M4 is turned off, and the M5 pulls up the potential of the charge storage point N and keeps the charge storage point N at a high level (i.e., logic "1").

What is claimed is:

1. A one-bit memory circuit for AMOLED (active-matrix organic light-emitting diode) panel sub-pixels, comprising a first MOS (Metal-Oxide-Semiconductor) transistor, a second MOS transistor, a capacitor, a light emitting diode, a control switch and an auxiliary latch circuit for receiving a latch signal;

wherein a gate and a first terminal except the gate of the second MOS transistor are connected to a scan line and a data line respectively, and a second terminal except the gate is connected to a gate of the first MOS transistor via a charge storage point;

a first terminal and a second terminal except the gate of the first MOS transistor are connected to a first power terminal and a first terminal of the light emitting diode respectively;

a second terminal of the light emitting diode is connected to a second power terminal;

both terminals of the capacitor are connected to the charge storage point and the first power terminal respectively;

the auxiliary latch circuit is connected to the charge storage point, and forms a latch together with the first MOS transistor and the light emitting diode for latching a voltage on the capacitor; and the auxiliary latch circuit is connected to the charge storage point via the control switch; the control switch is for controlling quality mode;

wherein the control switch comprises a third MOS transistor, and the auxiliary latch circuit comprises a fourth MOS transistor and a fifth MOS transistor; wherein the second terminal except a gate of the fourth MOS transistor is connected to the first terminal except a gate of the fifth MOS transistor to form a bridge arm; the first terminal and the second terminal except a gate of the third MOS transistor are connected to the charge storage point and the midpoint of the bridge arm, respectively; the gate of the fourth MOS transistor is connected to the first terminal of the light emitting diode, and the first terminal except the gate of the fourth MOS transistor is connected to the first terminal; the gate of the third MOS transistor is connected to the gate of the fifth MOS transistor and to the second terminal except the gate of the fifth MOS transistor; and the gate of the fifth MOS transistor receives the latch signal.

2. The one-bit memory circuit according to claim 1, wherein the gate of the fifth MOS transistor is connected to the second terminal.

3. The one-bit memory circuit according to claim 1, wherein the gate of the third MOS transistor is connected to the second terminal.

* * * * *